US012809274B2

(12) United States Patent
Machnovsky et al.

(10) Patent No.: US 12,809,274 B2
(45) Date of Patent: Nov. 24, 2026

(54) HIGH THROUGHPUT OPTICAL MEASUREMENT SYSTEM

(71) Applicant: NOVA LTD., Rehovot (IL)

(72) Inventors: Slava Machnovsky, Rehovot (IL); Daniel Ekeltchik, Rehovot (IL); Ohad Cohen, Rehovot (IL); Yosi Bar On, Rehovot (IL)

(73) Assignee: NOVA LTD., Rehovot (IL)

( * ) Notice: Subject to any disclaimer, the term of this patent is extended or adjusted under 35 U.S.C. 154(b) by 0 days.

(21) Appl. No.: 19/144,496

(22) PCT Filed: Dec. 29, 2022

(86) PCT No.: PCT/IB2022/062859
§ 371 (c)(1),
(2) Date: Jun. 29, 2025

(87) PCT Pub. No.: WO2024/141777
PCT Pub. Date: Jul. 4, 2024

(65) Prior Publication Data
US 2026/0118277 A1 Apr. 30, 2026

(51) Int. Cl.
*G03F 7/00* (2006.01)

(52) U.S. Cl.
CPC .. *G03F 7/706831* (2023.05); *G03F 7/706849* (2023.05)

(58) Field of Classification Search
CPC ........... G01N 21/8806; G01N 21/9501; G01N 21/956; G01N 23/201; G01N 2223/6116; G01N 21/21; G01N 2223/054; G01N 2223/1016; G01N 2223/40; G01N 23/20008; G01N 21/211; G01N 2021/216; G01N 2021/217; G01N 2021/218; G01N 21/23; G01N 2021/212; G01N 2021/213; G01N 2021/214; G01N 2021/215; G01N 23/20025; G01N 23/20016; G01N 23/20033; G01N 21/95607; G01N 2021/95615; G01N 21/95623;
(Continued)

(56) References Cited

U.S. PATENT DOCUMENTS

2007/0121106 A1* 5/2007 Shibata .............. G01N 21/8806 356/237.2
2009/0201494 A1* 8/2009 Furman .............. G01N 21/9501 356/237.5
(Continued)

*Primary Examiner* — Christina A Riddle
(74) *Attorney, Agent, or Firm* — RECHES PATENTS

(57) ABSTRACT

There is provided an optical measurement system that may include a control unit, an optical unit, first and second optical heads (OHs), and first and second movement units. The optical unit is configured to direct, during a first period, an illumination beam towards the second OH. The first movement unit is arranged to move, during the first period, the first OH to a first OH measurement site of a sample while the second OH participates in performing second OH metrology iterations at a second OH measurement site of the sample. The second movement unit is configured to move the second OH, during the second period, to a new second OH measurement site of the sample while the first OH participates in performing first OH metrology iterations. The or more of the first OH metrology iterations differ from each other by the polarization parameter.

24 Claims, 16 Drawing Sheets

10

(58) Field of Classification Search

CPC . G01N 2021/9563; G01N 2021/95638; G01N 2021/95676; G01N 21/95684; G01N 21/95692; G01N 21/958; G01N 2223/401; G01B 11/24; G01B 2210/56; G01B 11/06; G01B 15/045; G01B 11/0608; G01B 11/0616; G01B 11/0625; G01B 11/0641; G01B 11/0633; G01B 11/065; G01B 11/0658; G01B 11/0666; G01B 11/0675; G01B 11/0683; G01B 11/2441; G01B 11/25; G01B 11/2518; G01B 11/2522; G01B 11/2527; G01B 11/2504; G01B 11/254; G01B 11/2545; G01B 11/2408; G01B 15/04; G01B 11/02; G03F 7/70625; G03F 7/20; G03F 7/70483; G03F 7/70491; G03F 7/705; G03F 7/70504; G03F 7/70605; G03F 7/70608; G03F 7/70616; G03F 7/70633; G03F 7/70641; G03F 7/7065; G03F 7/70653; G03F 7/70655; G03F 7/70658; G03F 7/70666; G03F 7/70675; G03F 7/70681; G03F 7/70683; G03F 7/706831; G03F 7/706833; G03F 7/706835; G03F 7/706837; G03F 7/706839; G03F 7/706841; G03F 7/706843; G03F 7/706845; G03F 7/706847; G03F 7/706849; G03F 7/706851; G03F 1/44; G03F 1/68; G03F 1/82; G03F 1/84; H01L 22/12; G05B 13/042; G06F 17/14; H10P 72/53; H10P 74/23; H10P 74/238; H10P 74/232; H10P 74/235; H10P 74/203; H10P 74/27; G06T 7/73

USPC ..... 355/18, 30, 52–55, 66–77; 356/399–401, 356/237.1–237.6

See application file for complete search history.

(56) References Cited

U.S. PATENT DOCUMENTS

| | | | | |
|---|---|---|---|---|
| 2014/0126049 | A1* | 5/2014 | Yamamoto | G02B 21/084 359/387 |
| 2018/0188192 | A1 | 7/2018 | Artemiev et al. | |
| 2018/0224753 | A1* | 8/2018 | Mathijssen | G03F 9/7088 |
| 2019/0384184 | A1* | 12/2019 | Pandey | G03F 7/70625 |
| 2020/0151600 | A1 | 5/2020 | Huang et al. | |
| 2021/0055699 | A1 | 2/2021 | Agarwal et al. | |
| 2021/0150387 | A1 | 5/2021 | Rothstein et al. | |
| 2021/0262950 | A1 | 8/2021 | Blasenheim et al. | |
| 2024/0012338 | A1* | 1/2024 | Cappelli | G03F 9/7069 |

* cited by examiner 11-2

19-1

19-2

19-3

19-4

200

1500

HIGH THROUGHPUT OPTICAL MEASUREMENT SYSTEM

BACKGROUND

An optical measurement system may include a single optical illumination and collection unit. A measurement iteration of such a system may be preceded by moving the single optical illumination and collection unit to an inspection site, setting the polarization of the single optical illumination and collection unit and just then—performing the measurement iteration. This process is time consuming and limits the throughput of the optical measurement system.

Optical measurement systems that have two fully separated optical illumination and collection units is very expensive and also is relatively big.

There is a growing need to provide an optical measurement system that has a high throughput and is cost effective.

SUMMARY

There may be provided a system, a method and a non-transitory computer readable medium that stores instructions for high throughput optical measurement.

BRIEF DESCRIPTION OF THE DRAWINGS

In order to understand the invention and to see how it may be carried out in practice, a preferred embodiment will now be described, by way of non-limiting example only, with reference to the accompanying drawings.

DETAILED DESCRIPTION OF THE DRAWINGS

Figure 1:
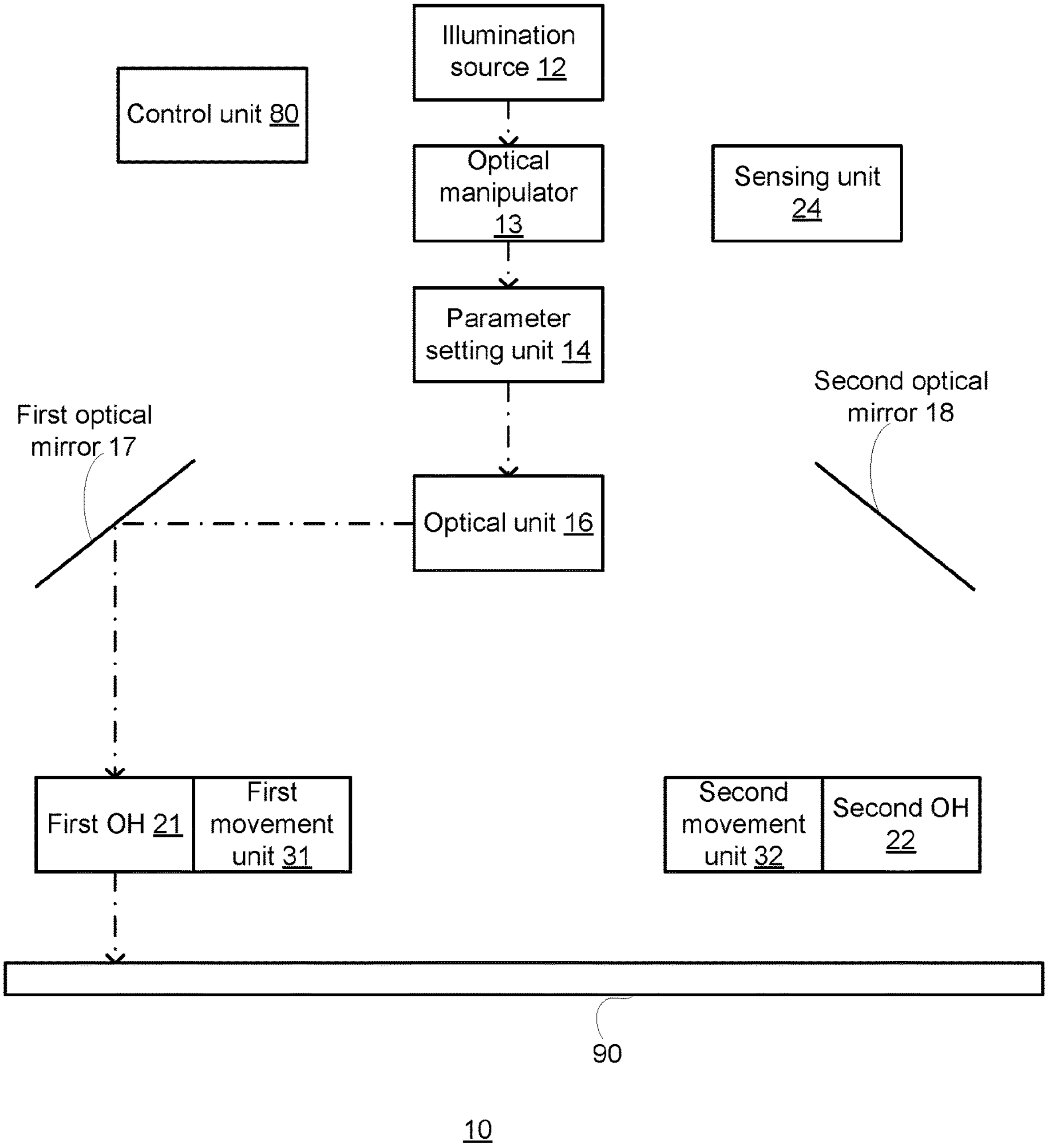
FIG. 1 illustrates an example of system and a sample.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to either one of a system, a method and a non-transitory computer readable medium should be applied mutatis mutandis to any other of the system, a method and a non-transitory computer readable medium. For example—any reference to a system should be applied mutatis mutandis to a method that can be executed by the system and to a non-transitory computer readable medium that may stores instructions executable by the system.

Because the illustrated at least one embodiment of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any number, or value illustrated below should be regarded as a non-limiting example.

Figure 2:
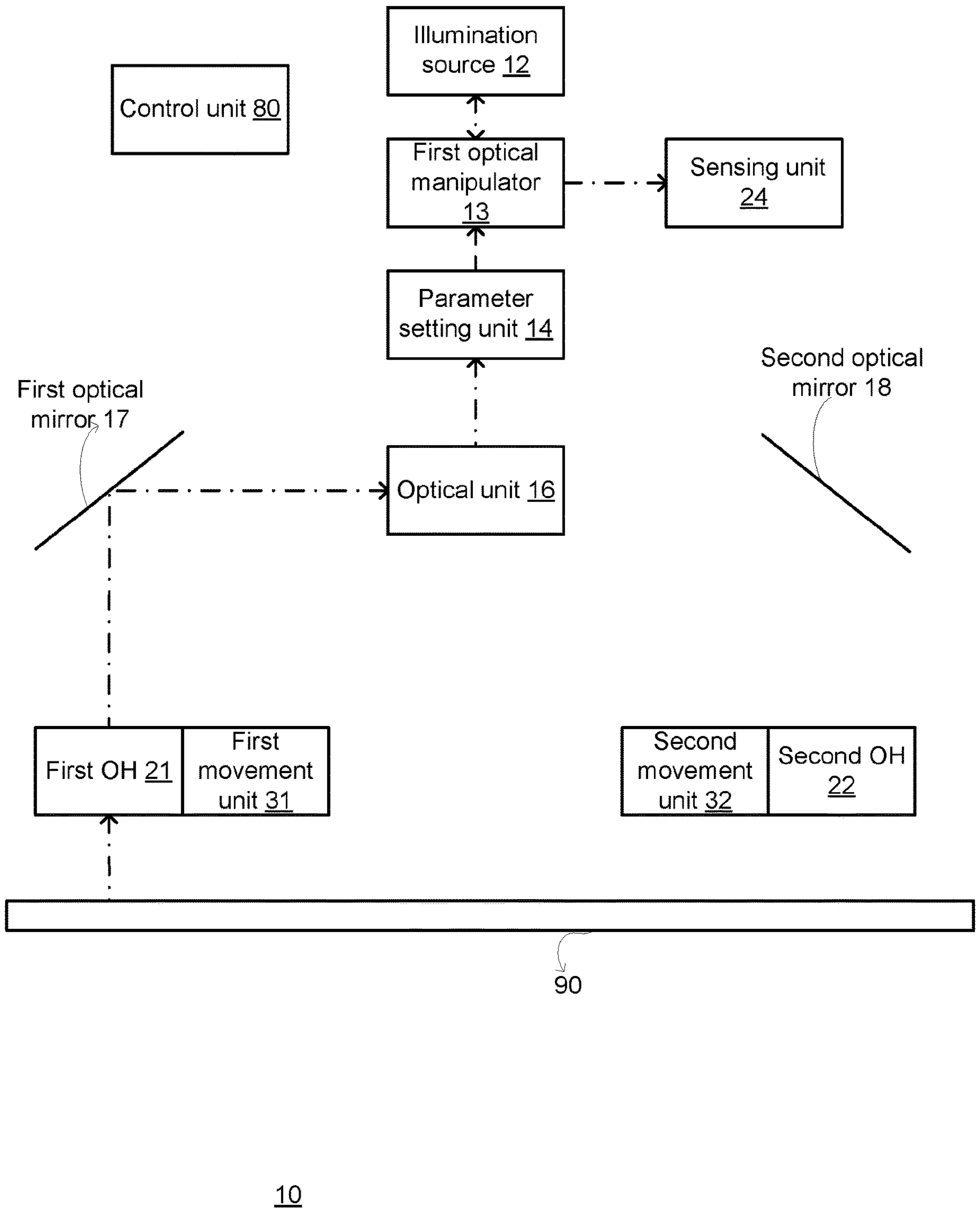
FIG. 2 illustrates an example of system and a sample.
Figure 3:
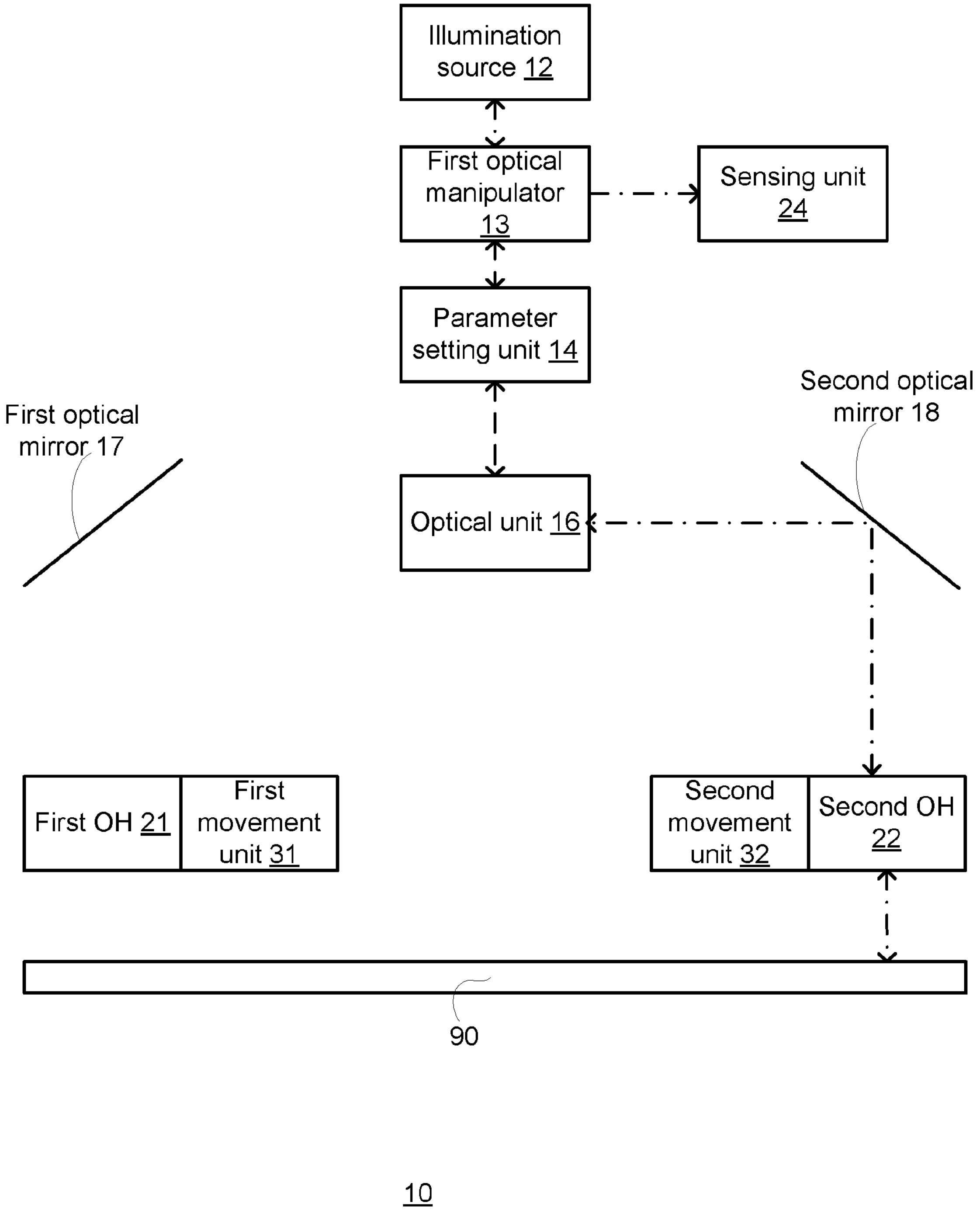
FIG. 3 illustrates an example of system and a sample.

FIGS. 1-3 illustrate an example of an optical measurement system 10. The optical measurement system 10 may be an integrated system.

The optical measurement system may include a control unit 80, an optical unit 16, a first optical head (OH) 21, a second OH 22, a first movement unit 31, a second movement unit 32, optical manipulator 13, a parameter setting unit 14, a sensing unit 24, and optics such as first mirror 17 and second mirror 18 for conveying light between the optical unit and a selected OH of the first OH and the second OH.

The control unit 80 is configured to control the units and/or components of the optical measurement system. For example—it may instruct a movement unit when to move and where to move, it may instruct the optical unit to select the first OH or the second OH, and the like.

The optical manipulator 13 may include a beam splitter, mirrors, or any other light directing elements and may be configured to direct light from the illumination source 12 to the parameter setting unit 14 and/or may be configured to direct light from the parameter setting unit 14 to the sensing unit 24.

Optical unit 16 may be configured to direct, during a first period, an illumination beam towards the second OH 22. The optical unit 16 may also be configured to direct, during a second period, the illumination beam towards the first OH 21. The first period may have the same duration as the second period but may be shorter or longer than the second period.

The optical unit 16 may be an optical switch, may be a rotating prism or may be any other optical component capable of selectively directing light to and from the first OH or the second OH.

Alternatively, optical unit 16 may be configured to direct, during a first period, an illumination beam over a measurement optical path and towards the second OH 22. The optical unit 16 may also be configured to direct, during the first period, over another path (such as an autofocus path or a navigation path) to the first OH 21. The optical unit 16 may also be configured to direct, over a measurement optical path and during a second period, the illumination beam towards the first OH 21. The optical unit 16 may also be configured to direct, during the second period, over another path (such as an autofocus path or a navigation path) to the second OH 22.

Alternatively, the optical unit 16 may be a double optical switch, may be a pair of rotating prisms or may be any other optical component capable of (a) selectively directing light to and from the first OH over a measurement optical path while directing other light to and from the second OH over another path (such as an autofocus path or a navigation path), and (b) selectively directing light to and from the second OH over a measurement optical path while directing other light to and from the first OH over another path (such as an autofocus path or a navigation path).

For simplicity of explanation the following text refers to a passage of light over the measurement optical path only.

The first movement unit 31 may be arranged to move, during the first period, the first OH 21 to a first OH measurement site of a sample while the second OH 22 participates in performing second OH metrology iterations at a second OH measurement site of the sample. The participation may include performing part of the second OH metrology iterations—for example by focusing light towards the second measurement site and/or collecting light scattered from the second measurement site.

At least two of the second OH metrology iterations may differ from each other by a polarization parameter—or by any other illumination and/or collection parameter. The polarization parameter may be a polarization of the illuminated beam. The polarization parameter may be a polarization of a detected beam sensed by the sensing unit.

The second movement unit 32 may be configured to move the second OH 22, during the second period, to a new second OH measurement site of the sample while the first OH participates in performing first OH metrology iterations. At least two of the first OH metrology iterations differ from each other by the polarization parameter—or by any other illumination and/or collection parameter. The second OH 22 may use a navigation unit including image acquisition/processing utilities to navigate the movement. Generally, navigating between measurement sites could be performed based on global alignment (metrology recipe includes coordinates of predetermined measurement site that could be transformed into metrology system coordinate system). So, "coarse" alignment might be performed without imaging/navigation unit. Since the measurement sites could be very small (few/dozens of microns) another fine alignment might be required. In that case, image based navigation procedure could be performed.

The second movement unit 32 may be independent of the first movement unit 31. This independency means that one movement unit may move regardless the second movement unit.

The movement units 31, 32 might include X-Y mechanical stages controlled by appropriate controllers. There could be some overlapping between the X-Y mechanical stages. The mechanical stages might include common elements, e.g. common supporting frame(s), guide(s), etc. The range of movement should be sufficient to cover entire area of the sample/wafer.

Sample handling arrangement holding the sample during the measurements could be provided. It might be movable, e.g. rotatable chuck (vacuum operated) movable along Z-axis. Z-axis movement provides e.g. for autofocusing purposes and corresponding drive unit could be connectable to auto focus unit 40.

The control unit 80 may be configured to configure a parameter setting unit such as a polarization unit (denoted 15 in FIG. 4) to set a polarization parameter before each metrology iteration of the first OH metrology iterations and the second OH metrology iterations. FIG. 1 illustrates a parameter setting unit 14 that may set a polarization or any other parameter of illumination and/or collection.

The optical unit may include a rotatable mirror that may be configured to rotate between a first position and a second position—thereby selecting the first OH or the second OH.

Each one of the first OH and the second OH may include an objective lens and radiation directing optics—or any other optical components.

The sensing unit 24 may be configured to sense signals during each metrology iteration of the first OH metrology iterations and the second OH metrology iterations. The sensed signals may be provided to an image processor or other processing circuit for drawings conclusions from the measurement iterations.

The sample may be a semiconductor wafer.

The metrology iterations of the first OH metrology iterations and the second OH metrology iterations may involve measuring parameters of patterned structures of the sample.

FIG. 1 illustrates the optical measurement system 10 when the first OH 21 is selected and light is directed towards the first OH 21 and onto sample 90.

FIG. 2 illustrates the optical measurement system 10 when the first OH 21 is selected and light scattered from the sample 90 is collected by the first OH 21, directed towards the sensing unit 24, and sensed by the sensing unit 24.

FIG. 3 illustrates the optical measurement system 10 when the second OH 22 is selected. For brevity of explanation illustrated both the illumination of the sample 90 and the collection and sensing of light scattered from the sample 90.

The optical measurement system may include one or more additional units—such as an auto-focus unit and/or a calibration sensor. For simplicity of explanation some of the additional units are illustrated in FIG. 4.

Figure 4:
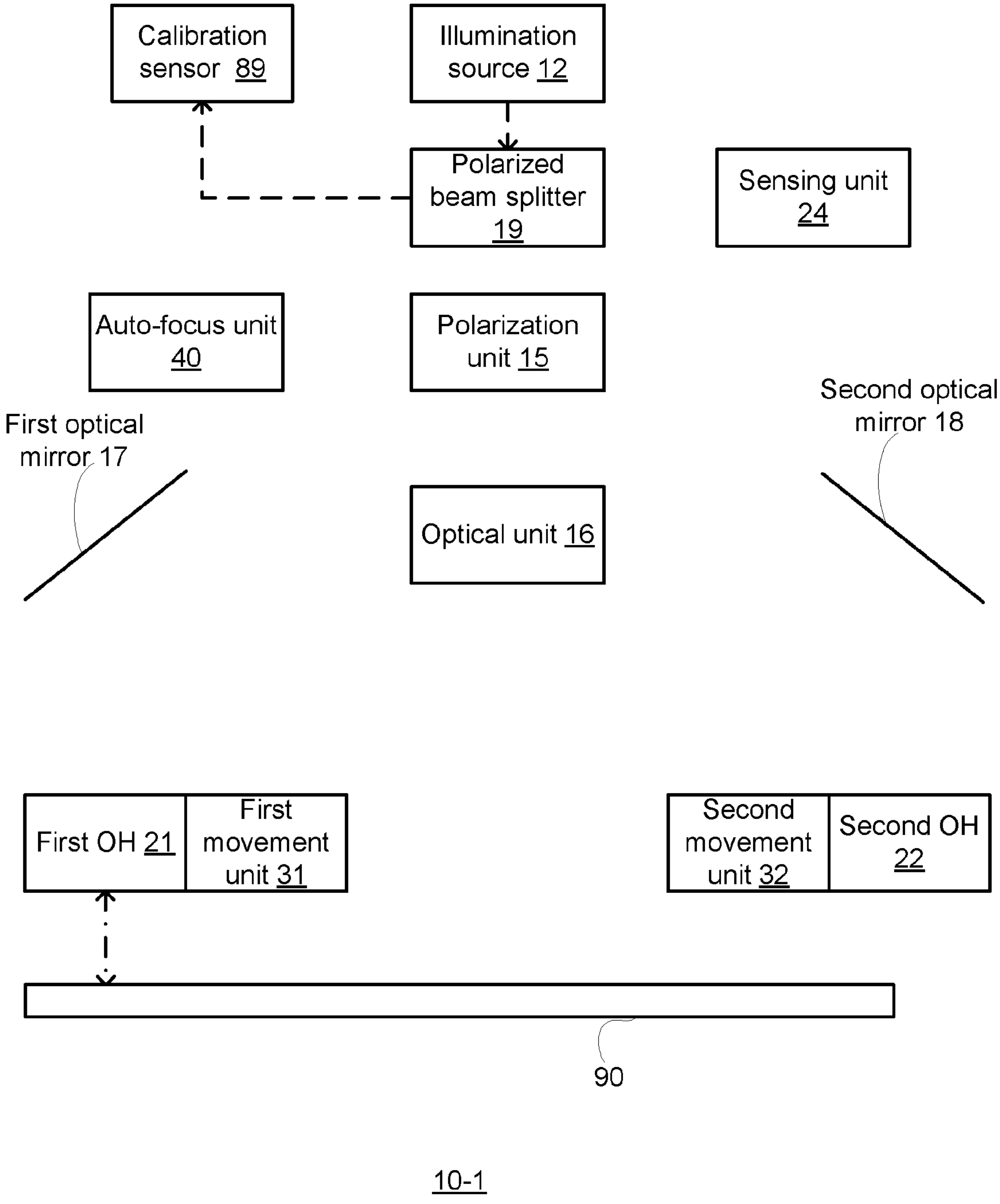
FIG. 4 illustrates an example of system and a sample.

FIG. 4 illustrates an example of optical measurement system 10-1.

Optical measurement system 10-1 of FIG. 4 differs from optical measurement system 10 of FIGS. 1-3 by having an auto-focus unit 40 and by having calibration sensor 89. In FIG. 4, the parameter setting unit is a polarization unit 15, and the optical manipulator might be a beam splitter 19.

The calibration sensor 89 may sense a fraction of a light beam emitted from the illumination source 12 and re-directed by beam splitter 19—and may be used to set the intensity (or other parameter) of the light beam to a desired value. 19 might be implemented as a beam splitter, "jumping mirror" etc.

The auto focus unit 40 may be configured to correct a focus of the first OH 21 in parallel to a configuring, by the control unit, of the polarization unit to set the polarization parameter to a certain value before performing a first OH metrology iteration.

Especially—the auto focus unit 40 may be configured to correct a focus of the first OH 21 in parallel to a configuring of the optical unit 16 to direct the illumination beam towards the first OH.

The auto focus unit may be configured to correct a focus of the first OH and to correct a focus of the second OH.

The auto focus unit 40 may be configured to correct a focus of the second OH 22 in parallel to a configuring, by the control unit, of a polarization unit to set the polarization parameter to a certain value before performing a second OH metrology iteration.

Especially—the auto focus unit 40 may be configured to correct a focus of the second OH 22 in parallel to a configuring of the optical unit 16 to direct the illumination beam towards the second OH.

Figure 5:
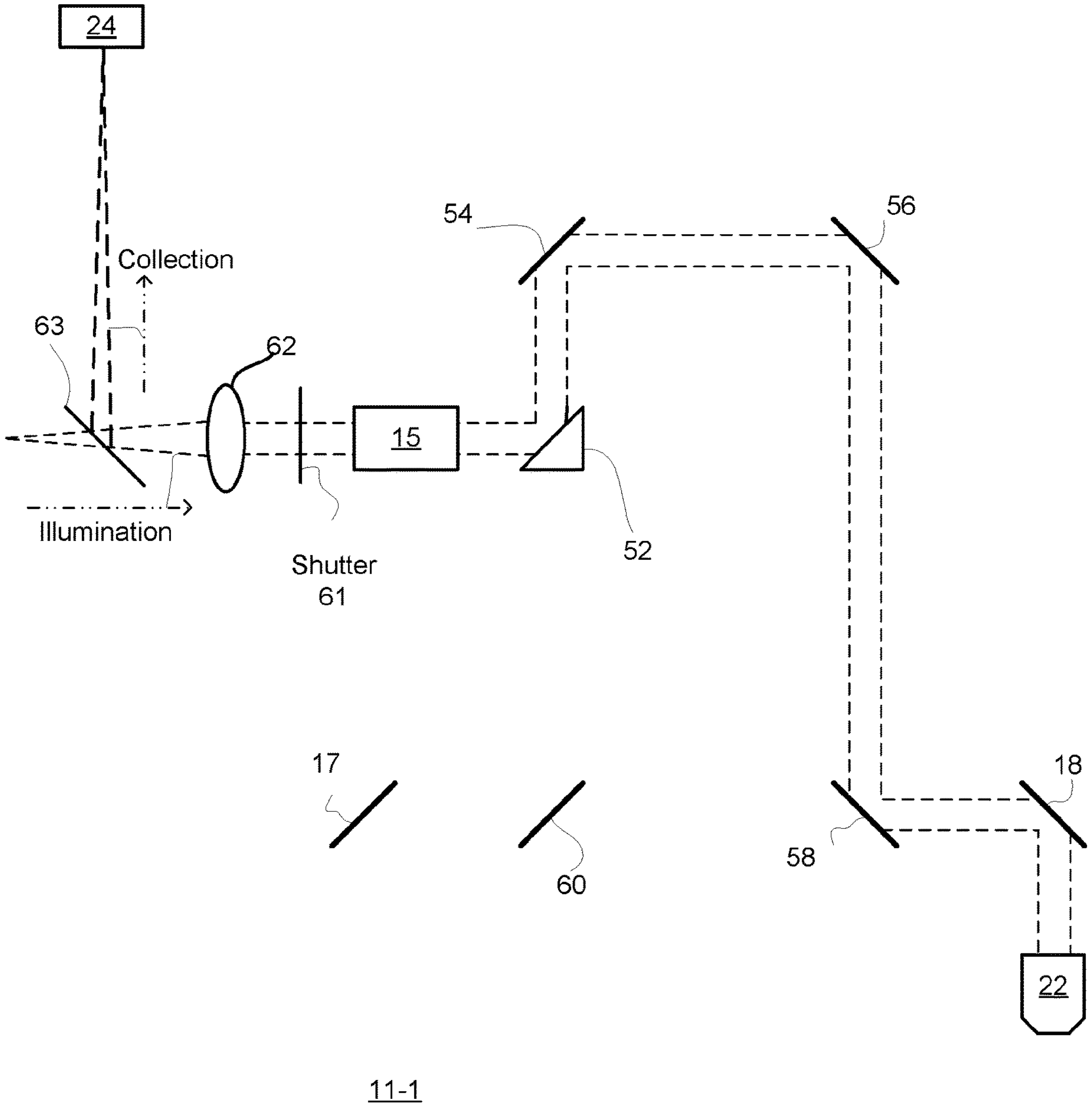
FIG. 5 illustrates an example of a first part of a system.

FIG. 5 illustrates a first part of optical measurement system 11-1 that includes sensing unit 24, additional beam splitter 63, shutter 61, tube lens 62, an optical unit that is a rotating prism/mirrors 52, multiple reflectors 17, 18, 54, 56, 58, and 60, first OH (not shown), second OH 22. FIG. 5 illustrates a selection of second OH 22.

Figure 6:
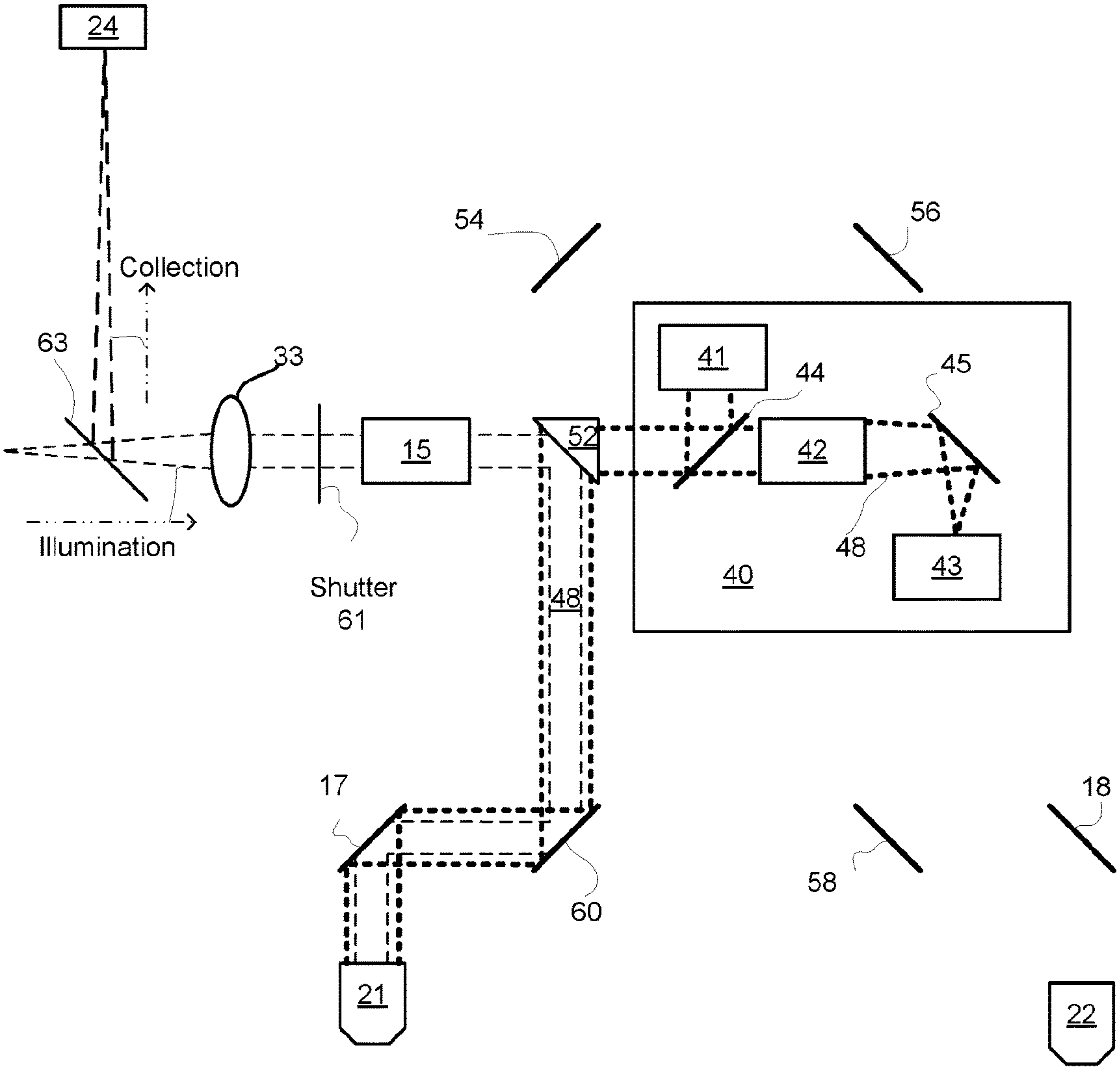
FIG. 6 illustrates an example of a first part of a system.

FIG. 6 illustrates a first part of optical measurement system 11-2 that includes sensing unit 24, additional beam splitter 63, shutter 61, tube lens 62, an optical unit that is a rotating prism/mirror(s) 52, multiple reflectors 17, 18, 54, 56, 58, and 60, first OH 21, second OH 22, and auto-focus unit 40 that includes AF illumination 41, vision TL 42, AF beam splitter and AF sensor 43. The AF beam splitter may also receive light from an AF light source (not shown) and convert it to AF beams (thick dotted lines) 48 that propagate along the same illumination and collection path as light beam 48. FIG. 5 illustrates a selection of first OH 21.

Figure 7:
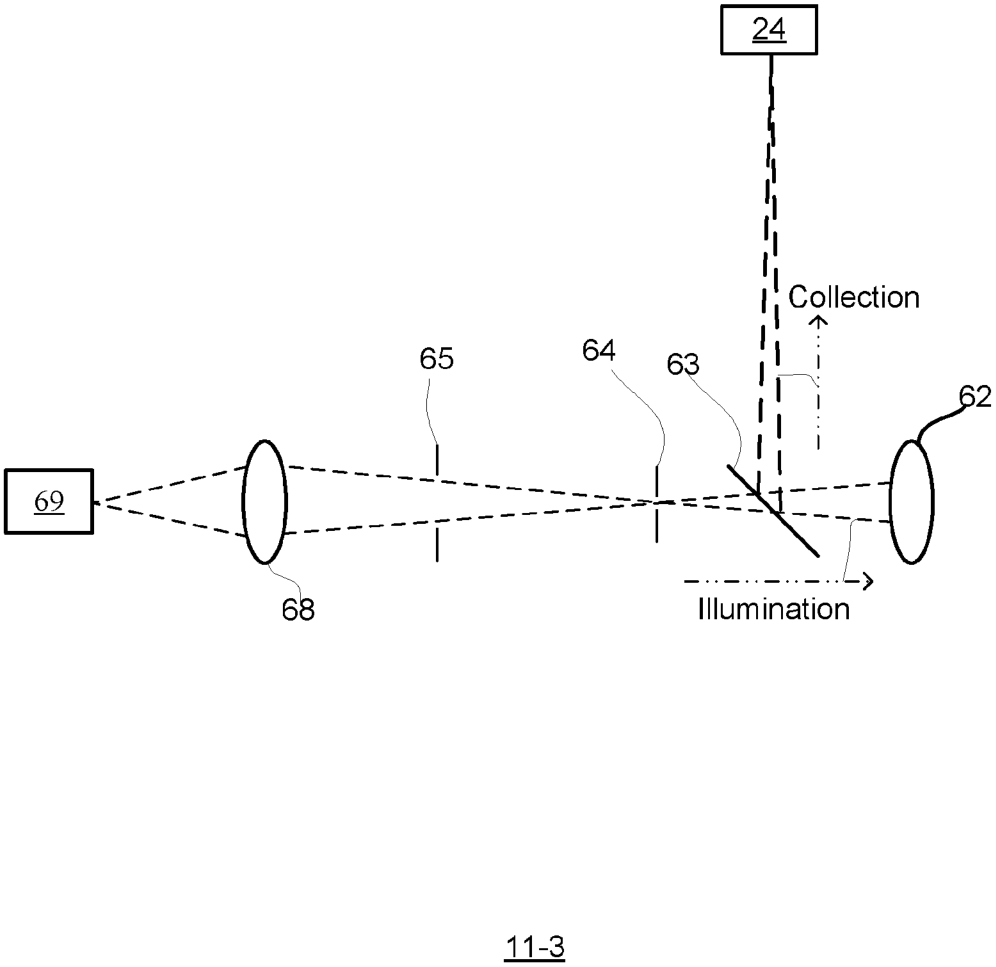
FIG. 7 illustrates an example of a second part of a system.

FIG. 7 illustrates a second part 11-3 of either one of the optical measurements systems of FIGS. 5 and 6.

For brevity of explanation sensing unit 24, additional beam splitter 63, and tube lens 62 are shown in each one of FIGS. 5, 6 and 7. The additional beam splitter is preceded by 64, fixed aperture 65, illumination relay lens 68 and light source 69.

Figure 8:
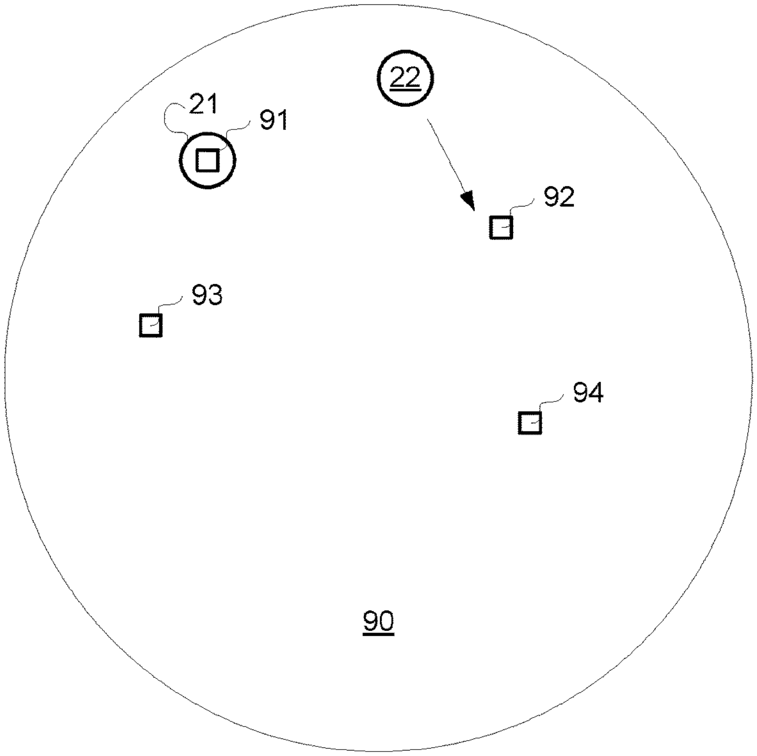
FIGS. 8-9 illustrates examples of scenarios.
Figure 8:
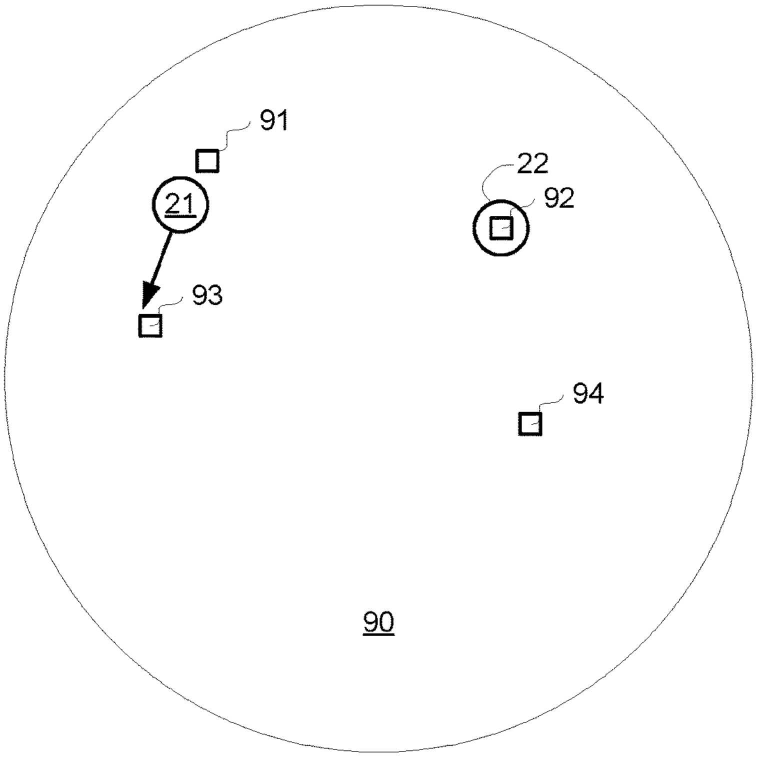
Figure 9:
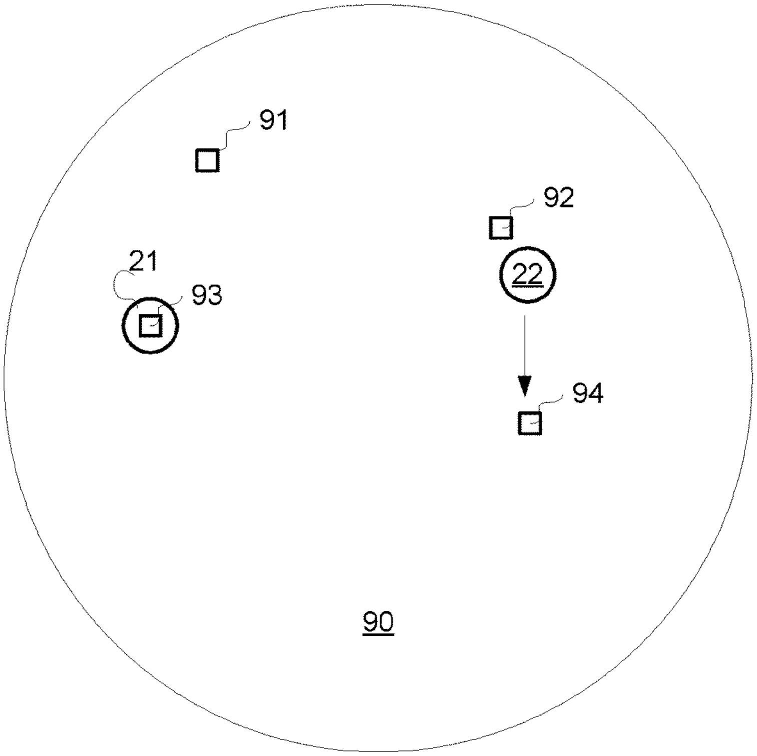
Figure 9:
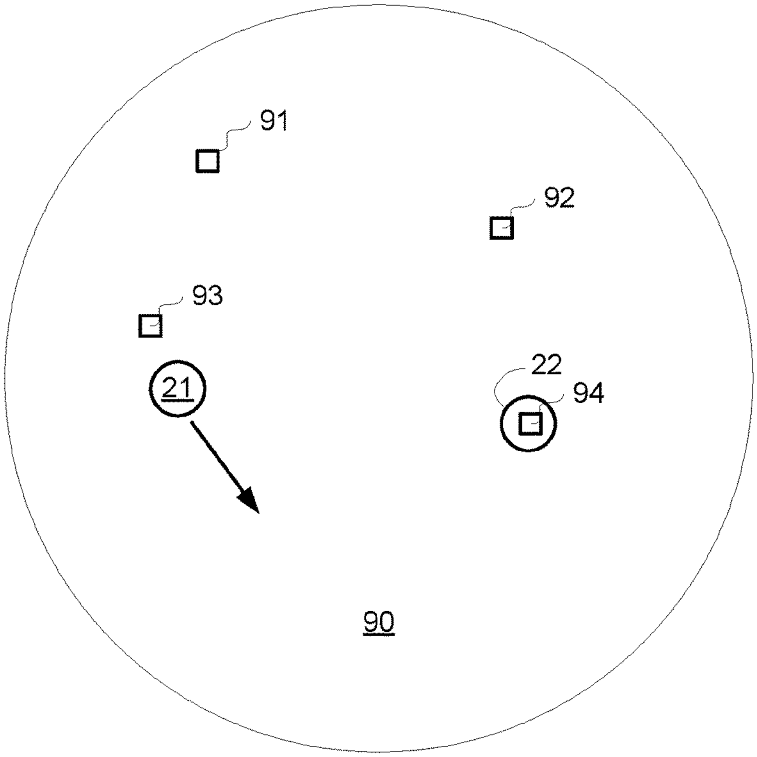

FIGS. 8 and 9 illustrate examples of four consecutive scenarios 19-1, 19-2, 19-3 and 19-4.

In the first scenario 19-1, first OH 21 participates in performing first OH metrology iterations at first measurement site 91 while the second OH 22 is moved from a previous measurement site (not shown) to a second measurement site 92.

In the second scenario 19-2, second OH 22 participates in performing second OH metrology iterations at second measurement site 92 while the first OH 21 is moved from the first measurement site 91 to another first measurement site 93.

In the third scenario 19-3, first OH 21 participates in performing first OH metrology iterations at the other first measurement site 93 while the second OH 22 is moved from the second measurement site 92 to another second measurement site 94.

In the fourth scenario 19-4, second OH 22 participates in performing second OH metrology iterations at the other second measurement site 94 while the first OH 21 is moved from the other first measurement site 93 to another first measurement site (not shown).

Figure 10:
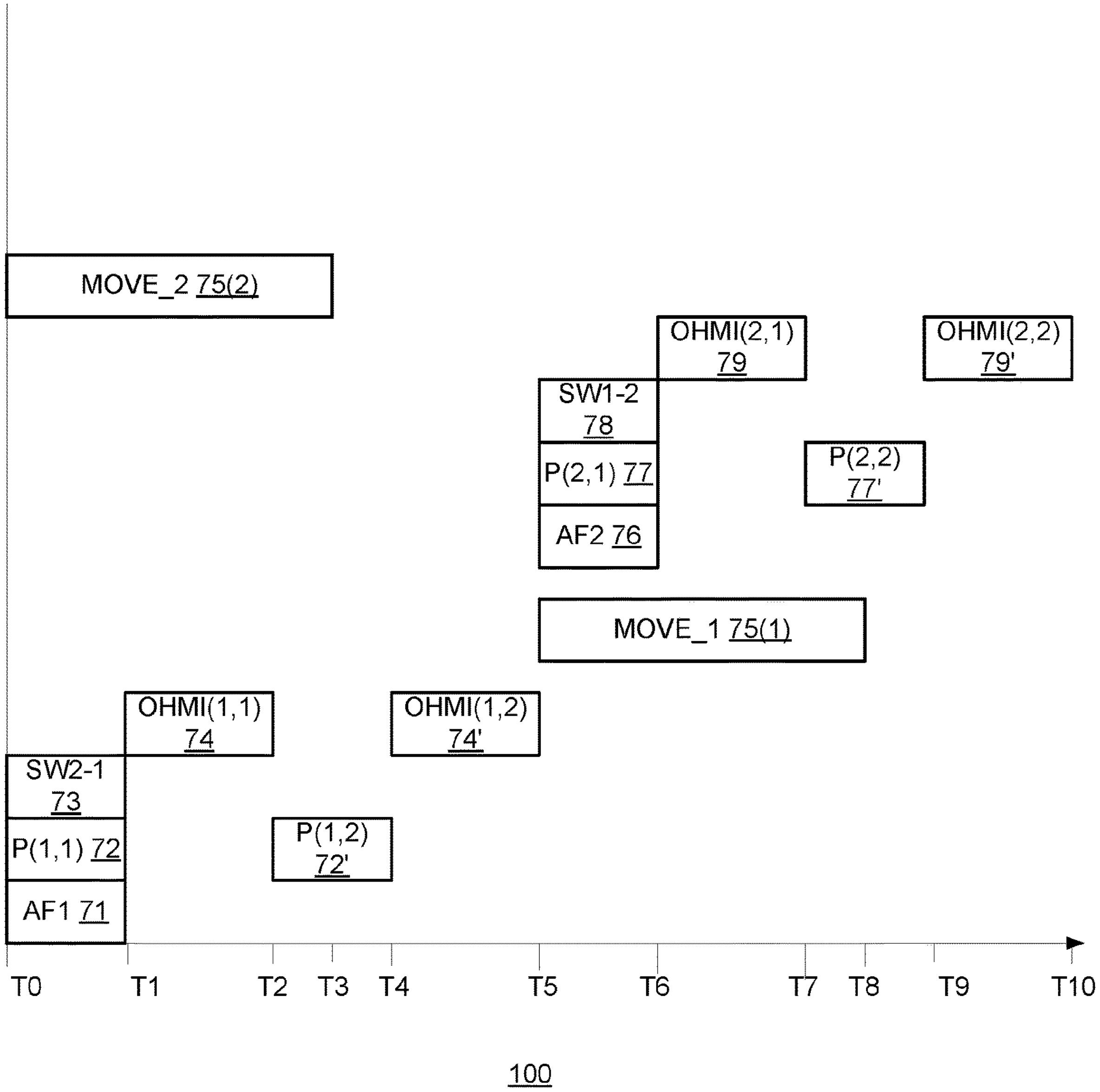
FIG. 10 illustrates an example of a timing diagram.

FIG. 10 is an example of a timing diagram and illustrates the following operations:

a. Moving (denoted MOVE_2 75(2)) second OH to a second measurement site.
b. Auto-focusing first OH (denoted AF1 71).
c. Setting (denoted SW2-1) the optical unit to select first OH.
d. Setting (denoted P(1,1) 72) a polarization parameter to a first value—for a first one of first OH metrology iterations.
e. Performing (denoted OHMI(1,1)) a first one of first OH metrology iterations.
f. Setting (denoted P(1,2) 72') a polarization parameter to a second value—for a second one of first OH metrology iterations.
g. Performing (denoted OHMI(1,2)) a second one of first OH metrology iterations.
h. Moving (denoted MOVE_1 75(1)) first OH to a new first measurement site.
i. Auto-focusing second OH (denoted AF2 76).
j. Setting (denoted SW1-2) the optical unit to select second OH.
k. Setting (denoted P(2,1) 77) a polarization parameter to a first value—for a first one of second OH metrology iterations.
l. Performing (denoted OHMI(2,1)) a first one of second OH metrology iterations.
m. Setting (denoted P(2,2) 77') a polarization parameter to a second value—for a second one of second OH metrology iterations.
n. Performing (denoted OHMI(2,2)) a second one of second OH metrology iterations.

In FIG. 10, AF1 71, P(1,1) 72 and SW2-1 72 are executed in parallel to each other (between T0 and T1)—and are followed by a sequence of OHMI(1,1) 74 (between T1 and T2), P(1,2) 72' (between T2 and T4), and OHMI(1,2) 74' (between T4 and T5). MOVE_2 75(2) is executed between T0 and T3.

In FIG. 10, AF2 77, P(2,1) 77 and SW1-2 78 are executed in parallel to each other (between T5 and T6)—and are followed by a sequence of OHMI(2,1) 79 (between T6 and T7), P(2,2) 77' (between T7 and T9), and OHMI(2,2) 77' (between T9 and T10). MOVE_1 75(1) is executed between T5 and F8.

The durations of AF1 71, P(1,1) 72 and SW2-1 72 may differ from each other. The durations of AF2 77, P(2,1) 77 and SW1-2 78 may differ from each other. There may be more than two consecutive measurement iterations between switching from one optical head to another.

Figure 11:
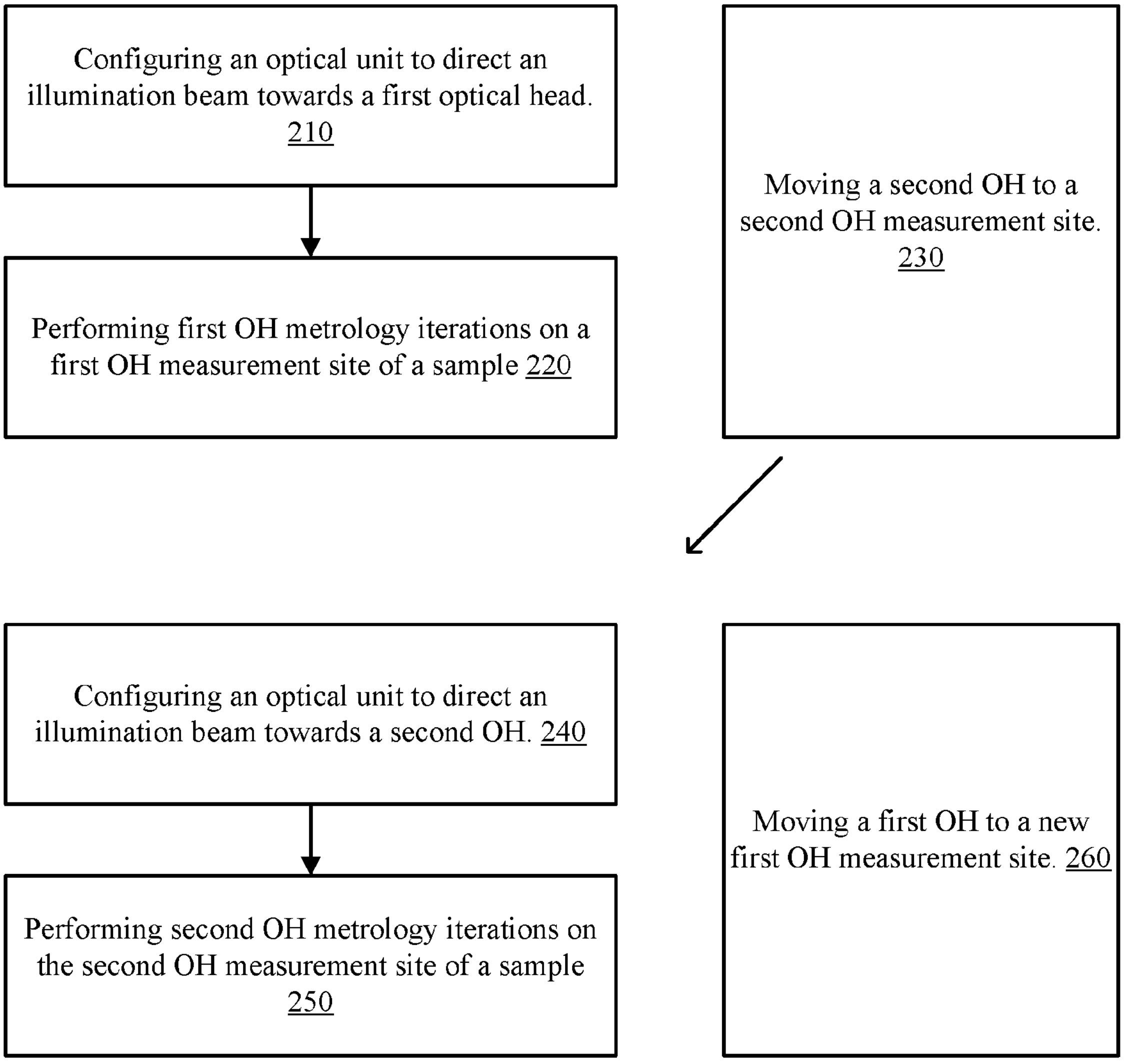
FIG. 11 illustrates an example of a method.

FIG. 11 illustrates an example of method 200 for high-throughput metrology of a multiple measurement sites on a sample.

Method 200 may start by step 210 of configuring an optical unit to direct an illumination beam towards a first optical head (OH).

Step 210 may be followed by step 220 of performing first OH metrology iterations on a first OH measurement site of a sample. At least two first OH metrology iterations differ from each other by a polarization parameter.

Method 200 may include step 230 of moving a second OH to a second OH measurement site while performing said first OH metrology iterations. Step 230 may overlap (or at least partially overlap) step 210 and/step 220. Method 200 may include navigating to the second OH measurement site while performing said first OH metrology iterations. The navigating may include using another sensing unit and/or another optics to obtain images.

Step 230 may be followed by step 240 of configuring the optical unit to direct the illumination beam towards the second OH.

Step 240 may be followed by step 250 of performing second OH metrology iterations on a second OH measurement site of the sample; wherein at least two second OH metrology iterations differ from each other by the polarization parameter.

Method 200 may include step 260 of moving the first OH to a new first OH measurement site of the sample while performing said second OH metrology iterations. Step 260 may overlap (or at least partially overlap) step 240 and/step 250. Method 200 may include moving OH1 to the first OH measurement site—while performing with OH2 metrology iterations and may include moving OH2 to the second OH measurement site—while performing with OH1 metrology iterations. The navigating may include using another sensing unit and/or another optics to obtain images.

See, for example the timing diagram of FIG. 10. —while one OH1 performs measurements and adjustments (focusing based on grabbed image by moving Visual Chanel tube lens (denoted 318 in FIGS. 14 and 15) and changing between two polarizations, the OH2 second channel (stage) moves to the next measurement site—and grabs an image), that time the first OH1 completed measurement and system switches—between OH1 and OH2 from measurement and visual modes. Now the OH1 moves to the next site, acquire image, while OH2 performs measurements and adjustments session based on acquired previously image.

The moving of the first OH is executed by a first movement unit, wherein the moving of the second OH is executed by a second movement unit that is independent of the first movement unit.

Method 200 may include configuring a polarization unit to set the polarization parameter before performing each metrology iteration of the first OH metrology iterations and the second OH metrology iterations.

Method 200 may include configuring a polarization unit to set the polarization parameter to a certain value before performing a first OH metrology iteration in parallel to a correcting of a focus of the first OH.

Method 200 may include correcting a focus of the second OH while configuring the optical unit to direct the illumination beam towards the first OH. The correcting of the focus may include using another sensing unit and/or another optics to obtain images.

Method 200 may include configuring a polarization unit to set the polarization parameter to a certain value before performing a second OH metrology iteration in parallel to a correcting of a focus of the second OH.

Method 200 may include correcting a focus of the second OH while configuring the optical unit to direct the illumination beam towards the first OH. The correcting of the focus may include using another sensing unit and/or another optics to obtain images.

The optical unit may include a rotatable mirror that is configured to rotate between a first position and a second position. The optical unit may include multiple rotating mirrors. The optical unit may include element for directing light for measurements and/or elements for directing light for auto-focus and/or elements for directing light for navigation (collectively—visual functionality).

The correcting of the focus of the first OH and the correcting of the focus of the second OH may be executed by an auto-focus unit that is shared between the first OH and the second OH.

Each one of the first OH and the second OH may include an objective lens and radiation directing optics.

The first OH and the second OH may be of millimetric dimensions and/or of a few centimeter dimensions.

There may be two or more pairs of OH that operate in the manner that the first and second OH operate.

Figure 12:
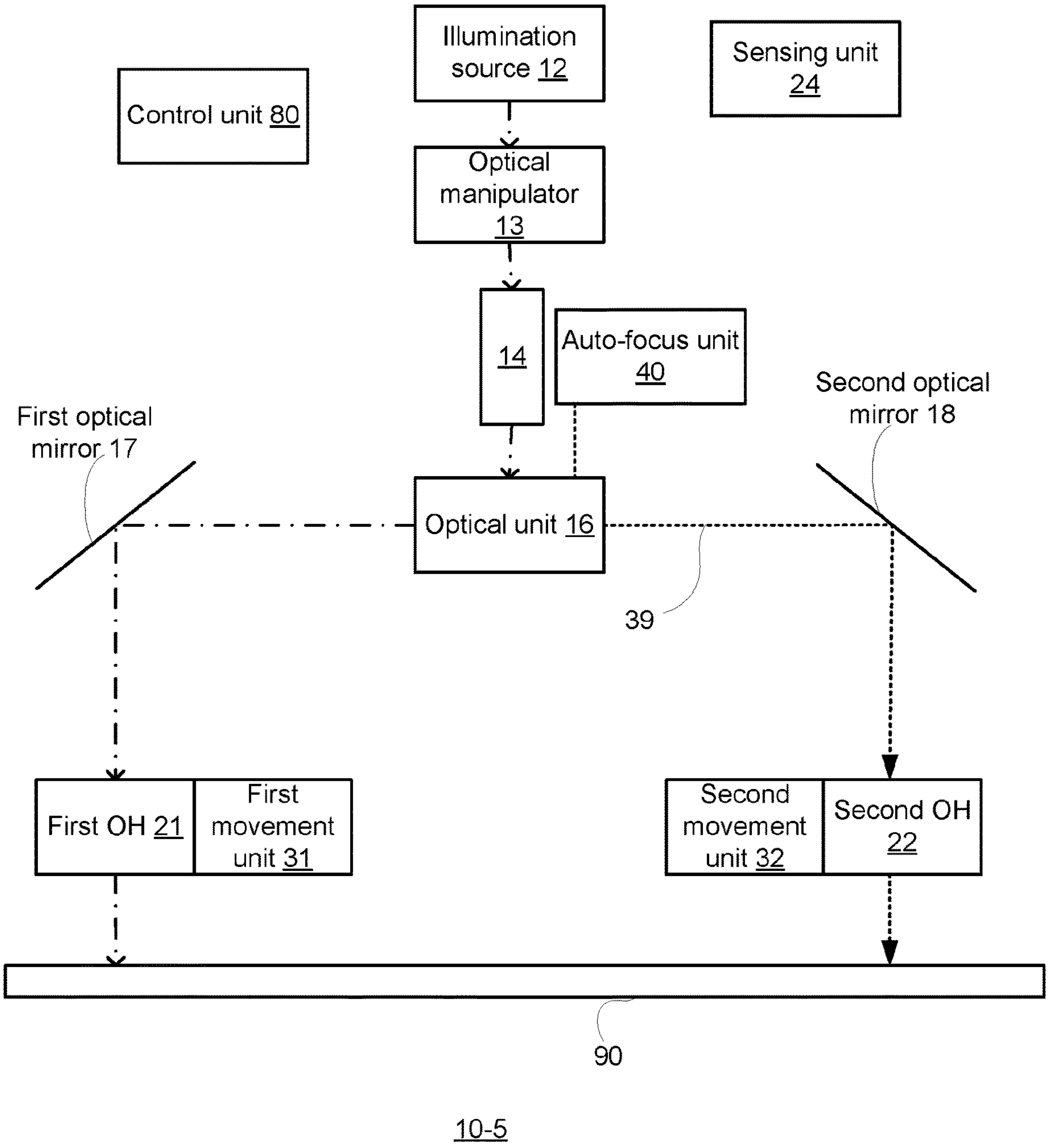
FIG. 12 illustrates an example of system and a sample.

FIG. 12 illustrates an example of optical measurement system 10-5.

Figure 13:
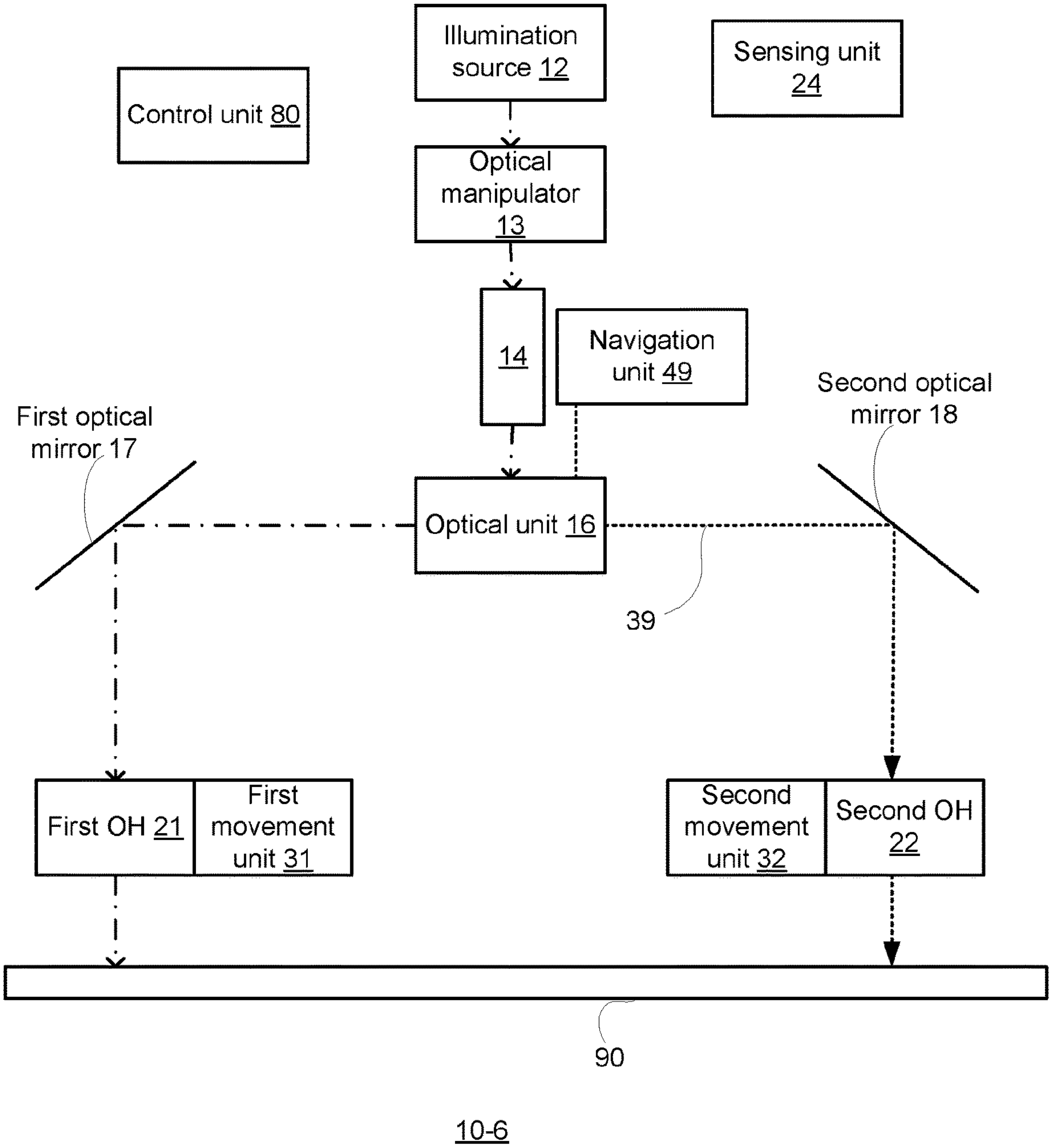
FIG. 13 illustrates an example of system and a sample.

Optical measurement system 10-5 of FIG. 12 differs from optical measurement system 10 of FIGS. 1-3 by having an auto-focus unit 40 and having an optical unit 16 that is configured to direct towards the second OH light 39 from auto-focus unit 40 and to direct light from the sample 90 towards the second OH and the auto-focus unit 40 while also directing light towards the first OH 21. The roles of the first OH and the second OH may be reversed during another period. The optical manipulator 13 may also impact radiation sent to and/or from the auto-focus unit 40 towards/from whether first OH or second OH FIG. 13 illustrates an example of optical measurement system 10-6.

Optical measurement system 10-5 of FIG. 12 differs from optical measurement system 10 of FIGS. 1-3 by having a navigation unit 49 and having an optical unit 16 that is configured to direct towards the second OH light 39 from navigation unit 49 and to direct light from the sample 90 towards the second OH and the navigation unit 49 while also directing light towards the first OH 21. The roles of the first OH and the second OH may be reversed during another period. The optical manipulator 13 may also impact radiation sent to and/or from the navigation unit 49 towards/from whether first OH or second OH The optical measurement system may also include an auto-focus unit and the navigation unit.

Figure 14:
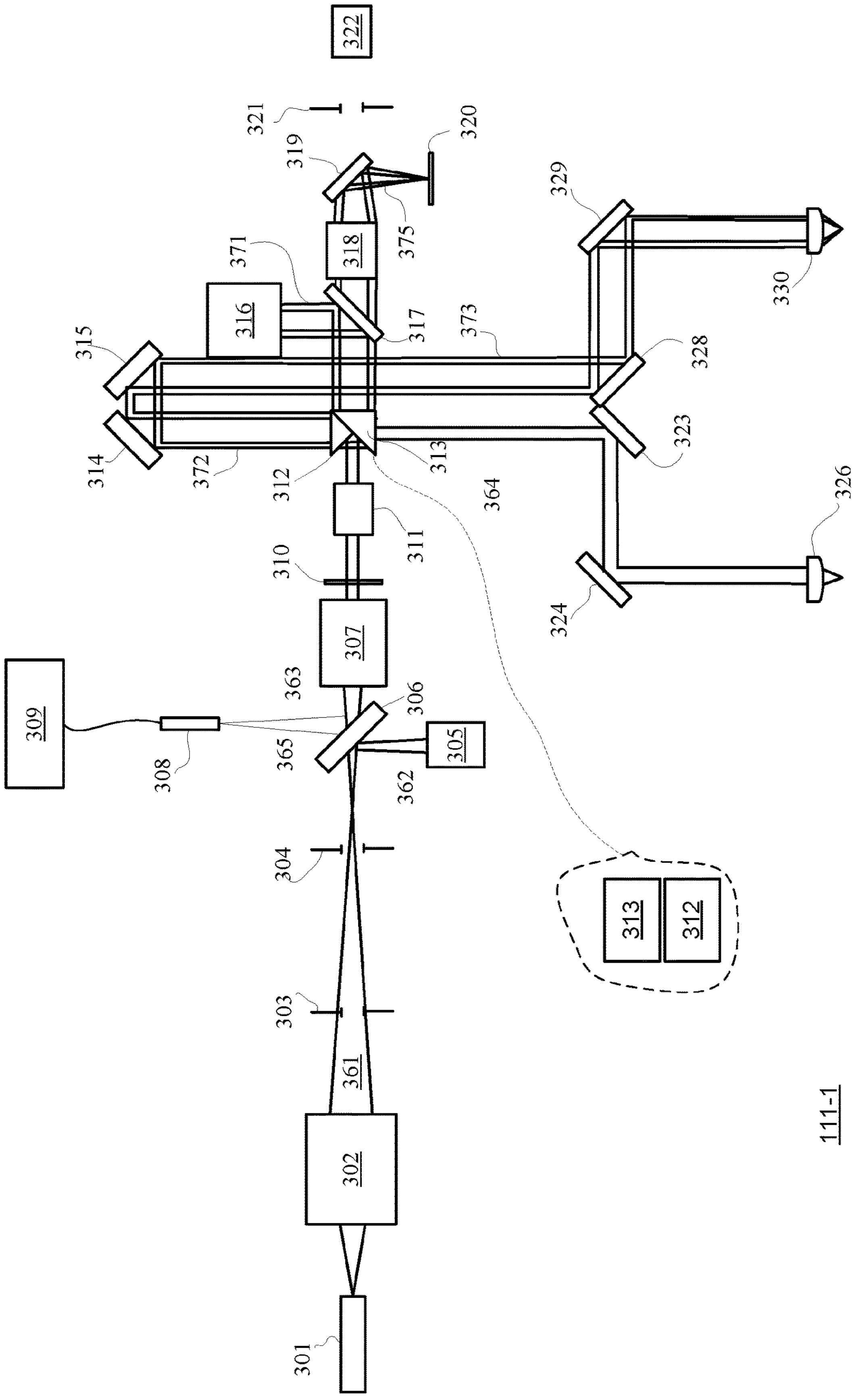
FIG. 14 illustrates an example of system and a sample.
Figure 15:
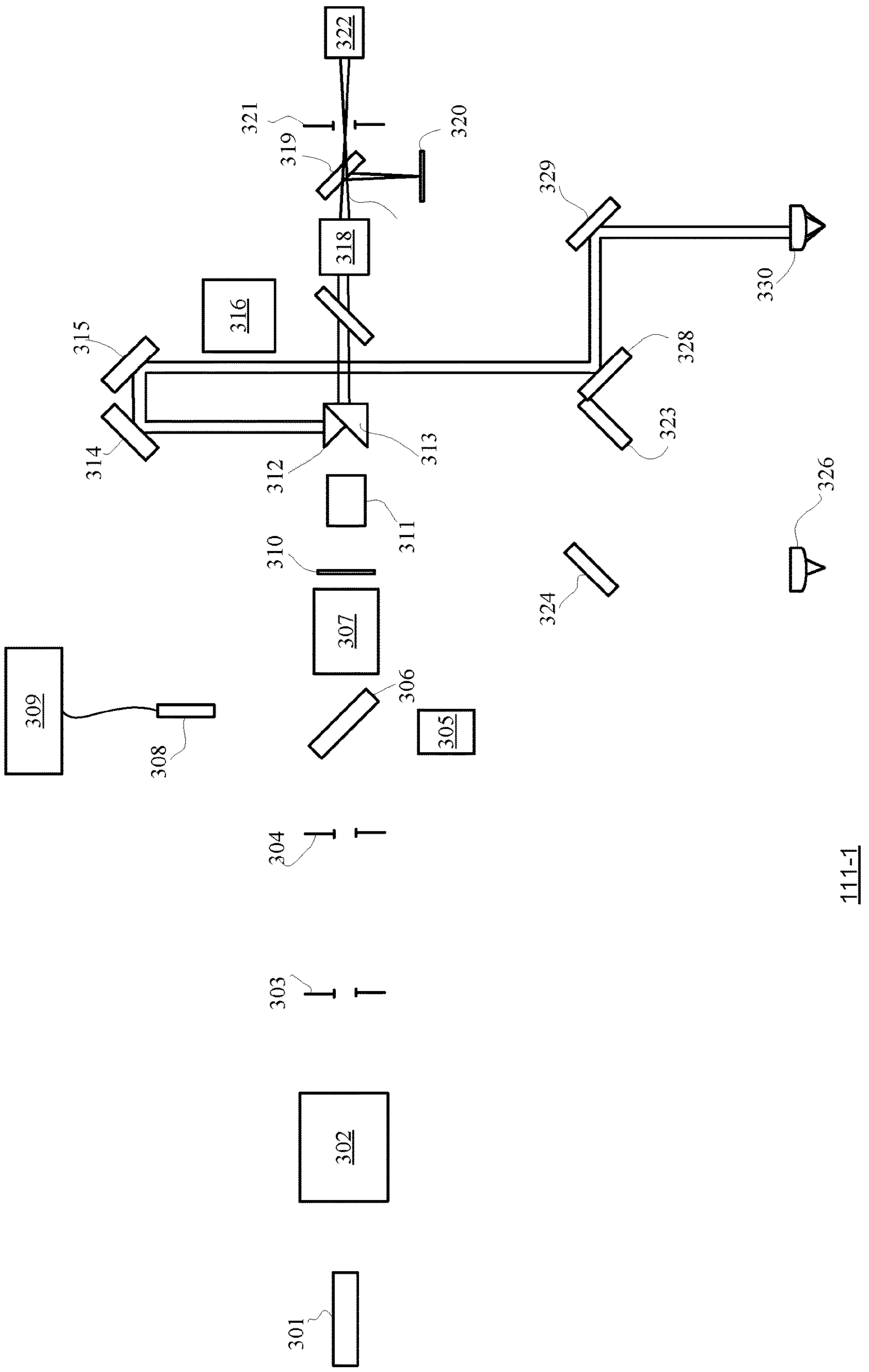
FIG. 15 illustrates an example of system and a sample.

FIGS. 14 and 15 illustrate examples of optical measurement system 111-1.

The optical measurement system 111-1 includes illumination fiber 301, illumination relay lens 302, field aperture 303, field stop 304, calibration sensor 305, first beam splitter 306, tube lens 307, sensor 308, spectrometer 309, shutter 310, polarizer 311, double prism/mirrors assembly that might include first prism 312 and second prism 313. The first prism and the second prism of the optical unit may be replaced by a double-sided double-sided rotatable mirror with multiple orientations (for example two orientations shifted by 180 degrees)—one side, depending on orientation re-direct light of “metrology channel” whether towards the $1^{st}$ or $2^{nd}$ OH and second side redirects light of visual channel whether towards the $2^{nd}$ or $1^{st}$ OH) It makes sense to show two states (orientations of 312), reflectors 314, 315, 319, 323, 324, 328 and 329, autofocus illumination source 316, second beam splitter 317, vision tube lens 318, another sensing unit 320, another field stop 321, fiber bundle 322, first objective lens 326, second objective lens 330.

Various components such as illumination fiber 301, illumination relay lens 302, field aperture 303 and field stop 304 may belong to an illumination source (denoted 12 in FIG. 1).

Various components such as sensor 305 and spectrometer 309 may belong to a sensing unit (denoted 24 in FIG. 1). Various components such as first beam splitter 306 that may redirect part of illumination light for calibrating/power monitoring to sensor 305 and also could re-direct returned from the sample light towards spectrometer 309. Various components such as tube lens 307, shutter 310 and polarizer 311 may belong to a parameter setting unit (denoted 14 in FIG. 1). Various components such as double prism may belong to a optical unit (denoted 16 in FIG. 1). Various components such as autofocus illumination source 316, second beam splitter 317, vision tube lens 318, and another sensing unit 320 (CCD) may belong to an auto focus unit (denoted 40 in FIG. 12).

Various components such as vision tube lens 318, another sensing unit 320 (for example a one or more dimensional sensor such as a CCD), another field stop 321 and fiber bundle 322 may belong to a navigation unit (denoted 49 in FIG. 13).

Assuming that during a certain period the first OH performs measurements. In this case, the illumination includes generating light and interacting with the following optical components 301, 302, 303, 304, 306 (part of the light is directed to 305 and most of the light proceeds to 307), 310, 311, 312, 323, 324, 326. Light from the sample interacts with the following optical components —326, 324, 323, 312, 311, 310, 307, 307 and 308. During that certain period the auto-focus includes generating another light and interacting with the following optical components 316, 317, 313, 314, 315, 328, 329 and 330. Another light from the sample interacts with the following optical components —330, 329, 328, 315, 314, 313, 317, 318, 319 and 320.

A further light unit may be used for navigation—for example for aligning the optical system with measurement site, initial object detection and the like. During that certain period the navigation includes generating another light and interacting with the following optical components 322, 321, 319, 318, 313, 314, 315, 328, 329 and 330. Further light from the sample interacts with the following optical components—330, 329, 328, 315, 314, 313, 317, 318, 319 and 320.

Figure 16:
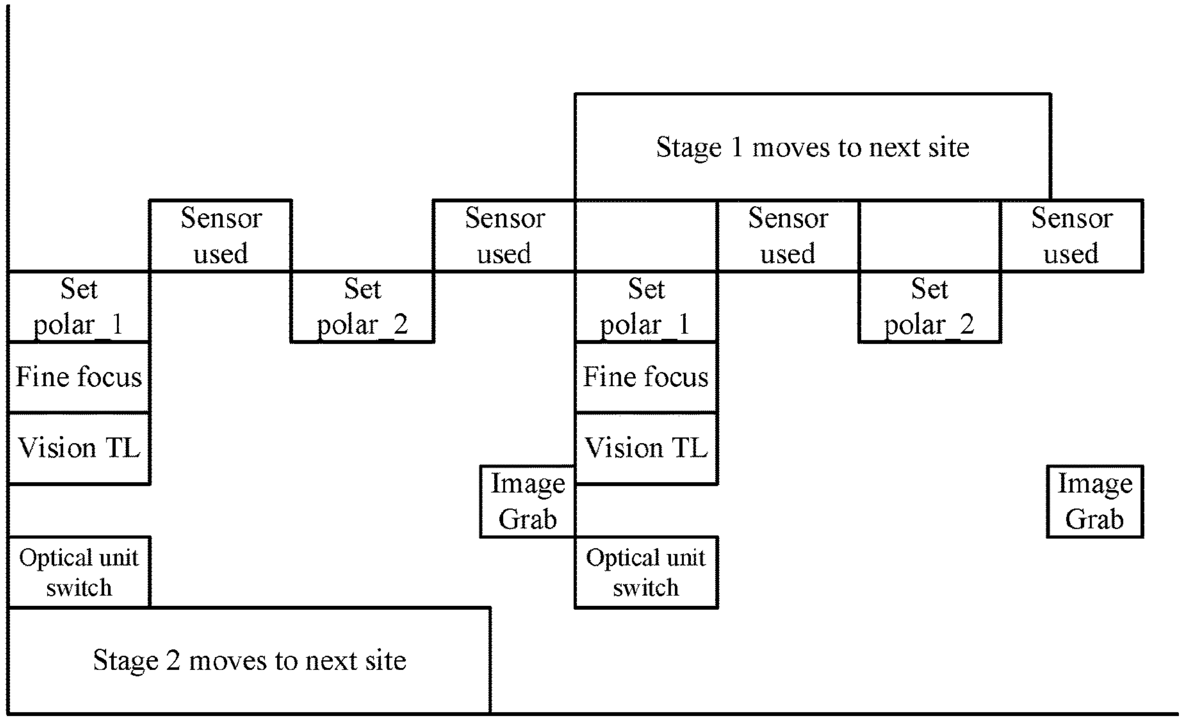
FIG. 16 illustrates an example of a timing diagram.

FIG. 16 illustrates an example of a timing diagram 1500 and illustrates:

a. Having OH1 perform metrology iteration which OH2 is moved and may perform vision (for example navigation using visual information obtained by second sensing unit).
b. Having OH2 perform metrology iteration which OH1 is moved and may perform vision (for example navigation using visual information obtained by second sensing unit).
c.

Stage 2 moves OH2 to next site. During this movement (may last, for example 220 milliseconds—or may have another duration).

Starting, for example, in parallel to the second stage movement and in parallel to each other:

a. Optical unit switch to propagate light to OH1 and may also change propagation of light related to navigation and/or auto focus.
b. Movement of visual channel lens (denoted 318 in FIGS. 14 and 15).
c. Fine focus adjustment—by moving a Z-stage and/or by moving measuring channel tube lens (denoted 307 in FIGS. 14 and 15).
d. Set polarization to be used during a first OH1 metrology iteration.

Proceeding by performing the first OH1 metrology iteration—including using a sensor—sensing by sensing unit that may include the spectrometer.

Proceeding by changing the polarization to be used during a second OH1 metrology iteration.

Proceeding by performing the second OH1 metrology iteration—including using a sensor—sensing by sensing unit that may include the spectrometer.

It should be noted that an image may be grabbed at the end of the movement of the second stage. The grabbed image may be used for navigation and/or for auto-focus.

The image may be grabbed at the end of the movement to guarantee that the OH reached the correct metrology site.

The grabbed image and/or visual acquisition not during metrology can be used for various purposes.

This is followed by switching the roles of OH1 and OH2.

a. Optical unit switch to propagate light to OH2 and may also change propagation of light related to navigation and/or auto focus.
b. Movement of visual channel lens (denoted 318 in FIGS. 14 and 15).
c. Fine focus adjustment—by moving a Z-stage and/or by moving measuring channel tube lens (denoted 307 in FIGS. 14 and 15).
d. Set polarization to be used during a first OH2 metrology iteration.

Proceeding by performing the first OH2 metrology iteration—including using a sensor—sensing by sensing unit that may include the spectrometer.

Proceeding by changing the polarization to be used during a second OH2 metrology iteration.

Proceeding by performing the second OH2 metrology iteration—including using a sensor—sensing by sensing unit that may include the spectrometer.

It should be noted that an image may be grabbed at the end of the movement of the second stage it can be used for navigation and/or auto-focus.

The image may be grabbed at the end of the movement to guarantee that the OH reached the correct metrology site.

The grabbed image and/or visual acquisition not during metrology can be used for various purposes.

The durations of the stages in timing diagram 10 and/or timing diagram 16 may be tens microseconds—for example 40, 50, 60, 70 milliseconds—while the movement may be longer—for example 200, 210, 220, 230 milliseconds. Other durations may be provided.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation; a single operation may be distributed in additional operations and operations may be executed at least partially overlapping in time. Moreover, alternative embodiments may include multiple instances of an operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an."

The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any reference to any of the terms "including", "comprising", "having" can be applied mutatis mutandis to the term "consisting" and/or "consisting essentially of".

We claim:

1. An optical measurement system that comprises:

a control unit;

an optical unit;

a first optical head (OH);

a second OH;

a first movement unit;

a second movement unit; and a sensing unit;

wherein the optical unit is configured to direct, during a first period, an illumination beam towards the second OH;

wherein the first movement unit is arranged to move, during the first period, the first OH to a first OH measurement site of a sample while the second OH participates in performing second OH metrology iterations at a second OH measurement site of the sample; wherein at least two of the second OH metrology iterations differ from each other by a polarization parameter;

wherein optical unit is configured to direct, during a second period, the illumination beam towards the first OH; and wherein the second movement unit is configured to move the second OH, during the second period, to a new second OH measurement site of the sample while the first OH participates in performing first OH metrology iterations; wherein at least two of the first OH metrology iterations differ from each other by the polarization parameter.

2. The optical measurement system according to claim 1 wherein the second movement unit is independent of the first movement unit.

3. The optical measurement system according to claim 1 wherein the control unit is configured to configure a polarization unit to set the polarization parameter before each metrology iteration of the first OH metrology iterations and the second OH metrology iterations.

4. The optical measurement system according to claim 1 comprising an auto focus unit.

5. The optical measurement system according to claim 4 wherein the auto focus unit is configured to correct a focus of the first OH in parallel to a configuring, by the control unit, of a polarization unit to set the polarization parameter to a certain value before performing a first OH metrology iteration.

6. The optical measurement system according to claim 4 wherein the auto focus unit is configured to correct a focus of the first OH in parallel to a configuring of the optical unit to direct the illumination beam towards the first OH.

7. The optical measurement system according to claim 4 wherein the auto focus unit is configured to correct a focus of the first OH and to correct a focus of the second OH.

8. The optical measurement system according to claim 1 wherein the optical unit includes a rotatable mirror that is configured to rotate between a first position and a second position.

9. The optical measurement system according to claim 1 wherein each one of the first OH and the second OH comprises an objective lens and radiation directing optics.

10. The optical measurement system according to claim 1 wherein the sensing unit is configured to sense signals during each metrology iteration of the first OH metrology iterations and the second OH metrology iterations.

11. The optical measurement system according to claim 1 wherein the polarization parameter is a polarization of the illuminated beam.

12. The optical measurement system according to claim 1 wherein the polarization parameter is a polarization of a detected beam sensed by the sensing unit.

13. The optical measurement system according to claim 1 wherein the optical measurement system is an integrated system.

14. The optical measurement system according to claim 1 wherein sample is a semiconductor wafer.

15. The optical measurement system according to claim 1 wherein the metrology iterations of the first OH metrology iterations and the second OH metrology iterations measure parameters of patterned structures of the sample.

16. The optical measurement system according to claim 1 comprising a navigation unit.

17. The optical measurement system according to claim 16 wherein the optical unit is also configured to direct, during the first period, another illumination beam towards or from the navigation unit.

18. A method for increasing metrology throughput for multiple measurement sites on a sample, the method comprises:

configuring an optical unit to direct an illumination beam towards a first optical head (OH);

performing first OH metrology iterations on a first OH measurement site of the sample; wherein at least two first OH metrology iterations differ from each other by a polarization parameter;

moving a second OH to a second OH measurement site while performing said first OH metrology iterations;

configuring the optical unit to direct the illumination beam towards the second OH;

performing second OH metrology iterations on a second OH measurement site of the sample; wherein at least two second OH metrology iterations differ from each other by the polarization parameter, and moving the first OH to a new first OH measurement site of the sample while performing said second OH metrology iterations.

19. The method according to claim 18 wherein the moving of the first OH is executed by a first movement unit, wherein the moving of the second OH is executed by a second movement unit that is independent of the first movement unit.

20. The method according to claim 18 comprising configuring a polarization unit to set the polarization parameter before performing each metrology iteration of the first OH metrology iterations and the second OH metrology iterations.

21. The method according to claim 18 comprising configuring a polarization unit to set the polarization parameter to a certain value before performing a first OH metrology iteration in parallel to a correcting of a focus of the first OH.

22. The method according to claim 18 comprising correcting a focus of the second OH while configuring the optical unit to direct the illumination beam towards the first OH.

23. The method according to claim 18 wherein the optical unit includes a rotatable mirror that is configured to rotate between a first position and a second position.

24. The method according to claim 18 wherein each one of the first OH and the second OH comprises an objective lens and radiation directing optics.

* * * * *